US012426280B2

(12) United States Patent
Chuang et al.

(10) Patent No.: US 12,426,280 B2
(45) Date of Patent: Sep. 23, 2025

(54) SEMICONDUCTOR STRUCTURE WITH INCREASED NUMBER OF STACKED MEMORY DIES AND METHOD OF MANUFACTURING THE SAME

(71) Applicant: CHANGXIN MEMORY TECHNOLOGIES, INC., Hefei (CN)

(72) Inventors: Ling-Yi Chuang, Hefei (CN); Kaimin Lv, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 419 days.

(21) Appl. No.: 18/164,235

(22) Filed: Feb. 3, 2023

(65) Prior Publication Data

US 2024/0057351 A1  Feb. 15, 2024

(30) Foreign Application Priority Data

Aug. 10, 2022 (CN) .......................... 202210959583.5

(51) Int. Cl.
*H10B 80/00* (2023.01)

(52) U.S. Cl.
CPC .................................. *H10B 80/00* (2023.02)

(58) Field of Classification Search
None
See application file for complete search history.

(56) References Cited

U.S. PATENT DOCUMENTS

| 8,390,109 B2 | 3/2013 | Popovic |
| 10,229,900 B2 | 3/2019 | Kim et al. |
| 10,811,386 B2 | 10/2020 | Chiu |
| 11,183,484 B2 | 11/2021 | Okutsu et al. |
| 2002/0084458 A1 | 7/2002 | Halbert |
| 2012/0211878 A1 | 8/2012 | Popovic |
| 2018/0040587 A1 | 2/2018 | Tao et al. |
| 2018/0114777 A1 | 4/2018 | Chiu et al. |

(Continued)

FOREIGN PATENT DOCUMENTS

| CN | 106847712 A | 6/2017 |
| CN | 108155174 A | 6/2018 |

(Continued)

*Primary Examiner* — Daniel Whalen
(74) *Attorney, Agent, or Firm* — SYNCODA LLC; Feng Ma

(57) ABSTRACT

A semiconductor structure, a method for manufacturing a semiconductor structure and a semiconductor device are provided. The semiconductor structure comprises: a logic die provided with a first wireless communication component; a plurality of memory components arrayed in a first direction and stacked on an upper surface of the logic die, the first direction being parallel to the upper surface of the logic die; and a first adhesive film arranged between any two adjacent memory components of the plurality of memory components and adhered to the any two adjacent memory components. Each of the plurality of memory components includes a plurality of memory dies arrayed in the first direction. Each of the plurality of memory dies is provided with a second wireless communication component. The second wireless communication component is in wireless communication with the first wireless communication component.

20 Claims, 10 Drawing Sheets

(56) References Cited

U.S. PATENT DOCUMENTS

2018/0158809 A1    6/2018  Kim et al.
2021/0143129 A1*   5/2021  Okutsu .................. H01L 24/73

FOREIGN PATENT DOCUMENTS

| CN | 113056819 | A  | 6/2021 |
| CN | 114664671 | A  | 6/2022 |
| JP | 2008235577 | A | 10/2008 |
| TW | 200608526 | A  | 3/2006 |
| WO | 8904113   | A1 | 5/1989 |

* cited by examiner

SEMICONDUCTOR STRUCTURE WITH INCREASED NUMBER OF STACKED MEMORY DIES AND METHOD OF MANUFACTURING THE SAME

CROSS-REFERENCE TO RELATED APPLICATION

This application is based upon and claims priority to Chinese Patent Application No. 202210959583.5, filed on Aug. 10, 2022 and entitled "SEMICONDUCTOR STRUCTURE, METHOD FOR MANUFACTURING SEMICONDUCTOR STRUCTURE, AND SEMICONDUCTOR DEVICE", the contents of which are incorporated herein by reference in its entirety.

BACKGROUND

In order to improve the integration of a semiconductor structure, more than one memory die can be placed in a same package structure. A High Bandwidth Memory (HBM) is a novel memory. An original one-dimensional memory layout is expanded to a three-dimensional memory layout by means of a memory die stacking technology represented by the HBM, i.e., a plurality of memory dies are stacked together and packaged, such that the density of the memory dies is greatly increased, and a large capacity and a high bit width are achieved.

However, it is difficult to further increase the number of stacked layers of the memory dies in the HBM. Further, the increase in the number of stacked layers of the memory dies will further affect the performance of the HBM.

SUMMARY

The disclosure belongs to the technical field of semiconductors, and in particular relates to a semiconductor structure, a method for manufacturing a semiconductor structure, and a semiconductor device.

Embodiments of the disclosure provide a semiconductor structure, a method for manufacturing a semiconductor structure, and a semiconductor device, which at least facilitates increasing the number of stacked layers of the memory dies, and improving the performance of the semiconductor structure.

According to some embodiments of the disclosure, in one aspect, the embodiments of the disclosure provide a semiconductor structure. The semiconductor structure includes: a logic die provided with a first wireless communication component; a plurality of memory components arrayed in a first direction and stacked on an upper surface of the logic die, the first direction being parallel to the upper surface of the logic die; and a first adhesive film arranged between any two adjacent memory components of the plurality of memory components and adhered to the any two adjacent memory components. Each of the plurality of memory components includes a plurality of memory dies arrayed in the first direction. Each of the plurality of memory dies is provided with a second wireless communication component. The second wireless communication component is in wireless communication with the first wireless communication component. At least one of the plurality of memory dies is provided with a power supply wiring layer. The power supply wiring layer extends towards the logic die along an active surface of the at least one of the plurality of memory dies.

According to some embodiments of the disclosure, in another aspect, the embodiments of the disclosure provide a method for manufacturing a semiconductor structure. The method for manufacturing the semiconductor structure includes the following operations. A logic die is provided, in which the logic die is provided with a first wireless communication component. A plurality of memory components are provided, in which each of the plurality of memory components includes a plurality of memory dies arrayed in the first direction, each of the plurality of memory dies is provided with a second wireless communication component, the second wireless communication component is in wireless communication with the first wireless communication component, and in which at least one of the plurality of memory dies is provided with a power supply wiring layer, the power supply wiring layer extends towards the logic die along an active surface of the at least one of the plurality of memory dies. The plurality of memory components are arrayed and adhered along the first direction by using a first adhesive film, in which the first adhesive film is arranged between any two adjacent memory components of the plurality of memory components. The plurality of memory components are connected to the logic die, in which the upper surface of the logic die is parallel to the first direction.

According to some embodiments of the disclosure, in yet another aspect, the embodiments of the disclosure provide a semiconductor device. The semiconductor device includes: a substrate; a logic die arranged on the substrate and provided with a first wireless communication component; a plurality of memory components arrayed in a first direction and stacked on an upper surface of the logic die, the first direction being parallel to the upper surface of the logic die; and a first adhesive film arranged between any two adjacent memory components of the plurality of memory components and adhered to the any two adjacent memory components. Each of the plurality of memory components includes a plurality of memory dies arrayed in the first direction. Each of the plurality of memory dies is provided with a second wireless communication component. The second wireless communication component is in wireless communication with the first wireless communication component. At least one of the plurality of memory dies is provided with a power supply wiring layer. The power supply wiring layer extends towards the logic die along an active surface of the at least one of the plurality of memory dies.

BRIEF DESCRIPTION OF THE DRAWINGS

The accompanying drawings herein are incorporated in and constitute a part of this specification, illustrate embodiments conforming to the disclosure, and, together with the description, serve to explain the principles of the disclosure. It is apparent that the accompanying drawings in the following description show merely some embodiments of the disclosure, and persons of ordinary skill in the art may still derive other drawings from these accompanying drawings without making creative efforts.

DETAILED DESCRIPTION

Figure 1:
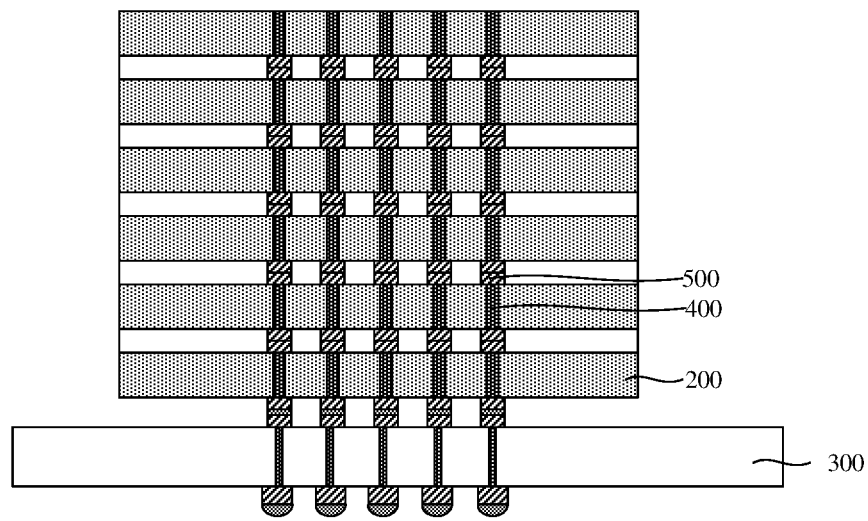
FIG. 1 illustrates a schematic diagram of a semiconductor structure.

As can be known from BACKGROUND, it is difficult to further increase the number of stacked layers of the memory dies in the HBM, and the increase in the number of stacked layers of the memory dies will further affect the performance of the HBM. With reference to FIG. 1, after analysis, it is found that the main reason is as follows. A plurality of memory dies 200 are stacked and bonded to each other by means of a hybrid bonding technology. However, due to the process limitations, the number of stacked layers of a single memory component is generally no more than eight, resulting in a lower capacity density of the memory dies 200. In addition, the arrangement direction of the plurality of memory dies 200 in the HBM is perpendicular to the upper surface of the logic die 300. Conductive through holes 400 in the plurality of memory dies 200 are electrically connected to bonding components 500, so as to form wired communication paths. In a case that the number of stacked layers is relatively large, there is a great difference between the communication distance between the topmost memory die 200 and the logic die 300 and the communication distance between the bottommost memory die 200 and the logic die 300, resulting in a relatively large difference in the communication delay between different memory dies 200 and the logic die 300, thereby affecting the running speed of a product.

The embodiments of the disclosure provide a semiconductor structure. The plurality of memory components are adhered to each other by the first adhesive film, so that the capacity density of the memory dies is increased. In addition, the stacking direction of the plurality of memory dies is parallel to the upper surface of the logic die, so that the communication distance between each memory die and the logic die is the same, thereby reducing the difference in the communication delay. Furthermore, the memory dies are in wireless communication with the logic die, so that it is unnecessary to manufacture the wired communication components on side surfaces of the memory dies, thereby reducing the process difficulty. In addition, the power supply wiring layer extends along the active surface of the memory die, so that the power supply wiring layer can be manufactured by utilizing the original back-end process of the memory die, so as to make the process simpler.

Hereinafter, the respective embodiments of the disclosure will be described in detail in combination with the accompanying drawings. However, those of ordinary skill in the art may understand that, in the respective embodiments of the disclosure, numerous technical details are set forth in order to provide a reader with a better understanding of the disclosure. However, the technical solutions claimed in the disclosure may also be implemented without these technical details and various changes and modifications based on the respective embodiments below.

As shown in FIG. 2 to FIG. 17, an embodiment of the disclosure provides a semiconductor structure. The semiconductor structure includes: a logic die 3 provided with a first wireless communication component 31; a plurality of memory components 100 arrayed in a first direction X and stacked on an upper surface of the logic die 3, the first direction X being parallel to the upper surface of the logic die 3; and a first adhesive film 74 arranged between any two adjacent memory components 100 of the plurality of memory components 100 and adhered to the any two adjacent memory components 100. Each of the plurality of memory components 100 includes a plurality of memory dies 1 arrayed in the first direction X. Each of the plurality of memory dies 1 is provided with a second wireless communication component 11. The second wireless communication component 11 is in wireless communication with the first wireless communication component 31. At least one of the plurality of memory dies 1 is provided with a power supply wiring layer 2. The power supply wiring layer 2 extends towards the logic die 3 along an active surface of the at least one of the plurality of memory dies 1. Such a design has the following advantages.

Firstly, the memory dies 1 are stacked in the direction parallel to the upper surface of the logic die 3, that is, the arrangement direction of the plurality of memory dies 1 is parallel to the upper surface of the logic die 3. Therefore, the distance between each memory die 1 and the logic die 3 is the same, which facilitates reducing the difference in the communication delay between different memory dies 1 and the logic die 3. In addition, compared with the vertical stack, parallel stack facilitates reducing the distance between the plurality of memory dies 1 and the logic die 3, so as to increase the communication speed. Meanwhile, more memory dies 1 may be stacked on the logic die 3.

Secondly, the power supply wiring layer 2 may lead the power supply signal lines 12 from the edge position of the memory die 1, which facilitates achieving the wired power supply to the memory die 1, thereby further improving the stability of power supply. The power supply wiring layer 2 extends along the active surface of the memory die 1, which means that the power supply wiring layer 2 is arranged on the front surface of the memory die 1. Therefore, after the components in the memory die 1 are manufactured, the power supply wiring layer 2 may be manufactured by utilizing the original back-end process, so as to make the process simpler. In addition, the power supply wiring layer 2 may only extend at the edge position near the upper side or the lower side of the memory die 1 without completely covering the whole active surface of the memory die 1. Therefore, the contact area between the power supply wiring layer 2 and the memory die 1 is small, so that the influence of the heat from the power supply wiring layer 2 on the memory die 1 is relatively small.

Thirdly, the area of the side surface of a single memory die 1 towards the logic die 3 is relatively small. After the plurality of memory components 100 are adhered together by the first adhesive film 74, the total area of the side surfaces of the plurality of memory dies 1 towards the logic die 3 is increased, which facilitates improving the structural strength. Moreover, the capacity density of the memory dies 1 can also be increased.

The semiconductor structure will be described in detail below.

The memory die 1 may be a die such as a Dynamic Random Access Memory (DRAM) or a Static Random-Access Memory (SRAM).

The memory die 1 has a front surface and a back surface opposite to each other, and a side surface connected between the front surface and the back surface. Two adjacent memory dies 1 may be stacked on each other in a front surface-to-front surface manner, or in a front surface-to-back surface manner, or in a back surface-to-back surface manner. The front surface of the memory die 1 may also be understood as the active surface 13. The back surface of the memory die 1 may also be understood as a non-active surface.

With reference to FIG. 2 to FIG. 5, the memory die 1 is in wireless communication with the logic die 3 through the first wireless communication component 31 and the second wireless communication component 11. It should be noted that the side surface of the memory die 1 is arranged towards the logic die 3, and the area of the side surface of the memory die is relatively small. The communication between the memory die 1 and the logic die 3 is realized by wireless communication, so that it is unnecessary to provide the wired communication component between the memory die 1 and the logic die 3, thereby reducing the process difficulty.

In some embodiments, the second wireless communication component 11 is arranged on a side of the memory die 1 towards the logic die 3. Therefore, the distance between the first wireless communication component 31 and the second wireless communication component 11 can be reduced, thereby improving the quality of the wireless communication.

The first adhesive film 74 will be described in detail below.

Figure 2:
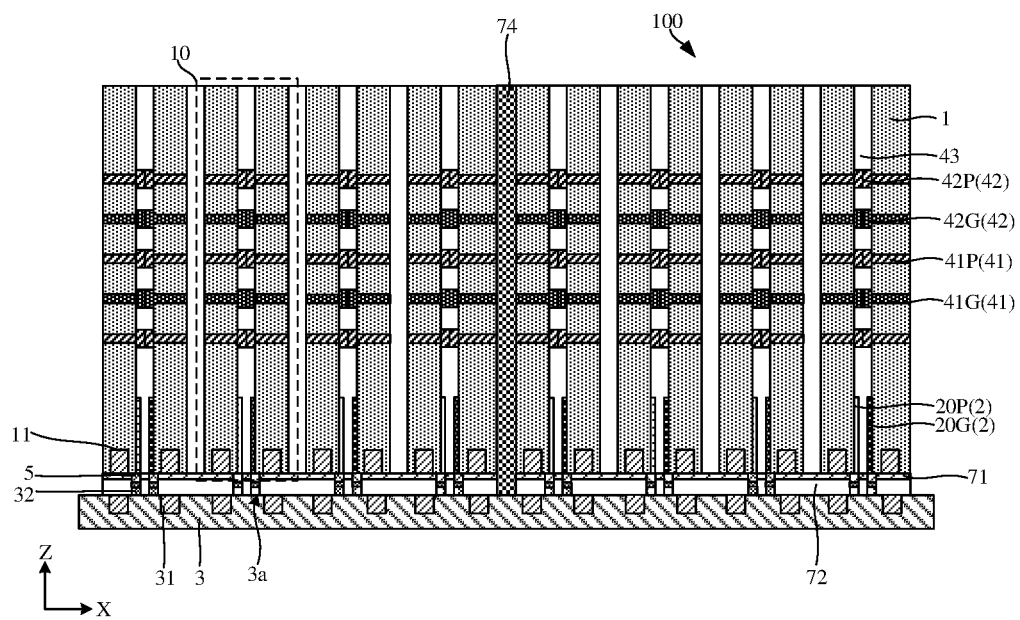
FIG. 2 to FIG. 5 respectively illustrate sectional views of four semiconductor structures according to an embodiment of the disclosure.
Figure 4:
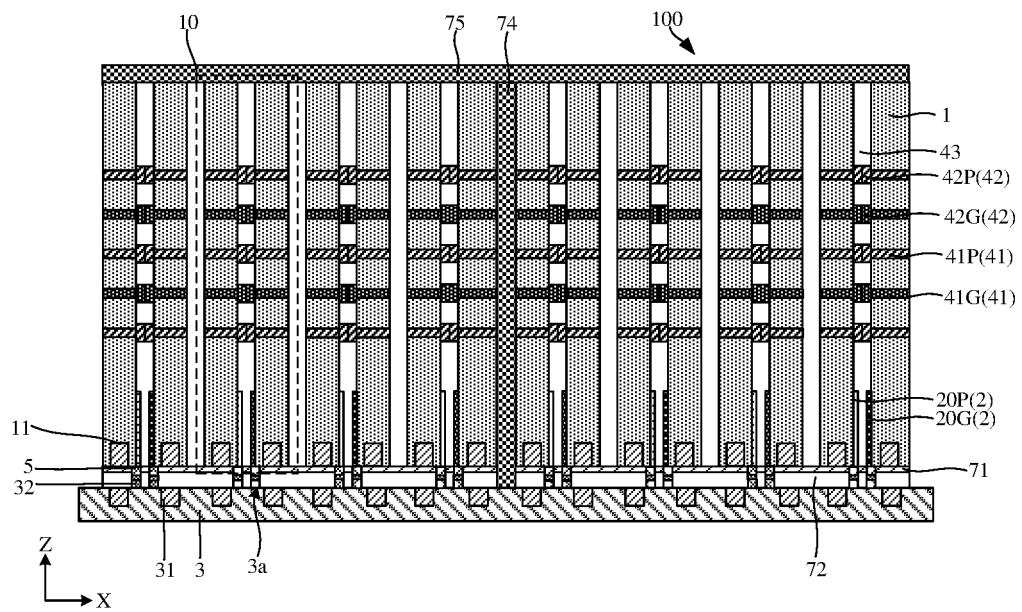
Figure 5:
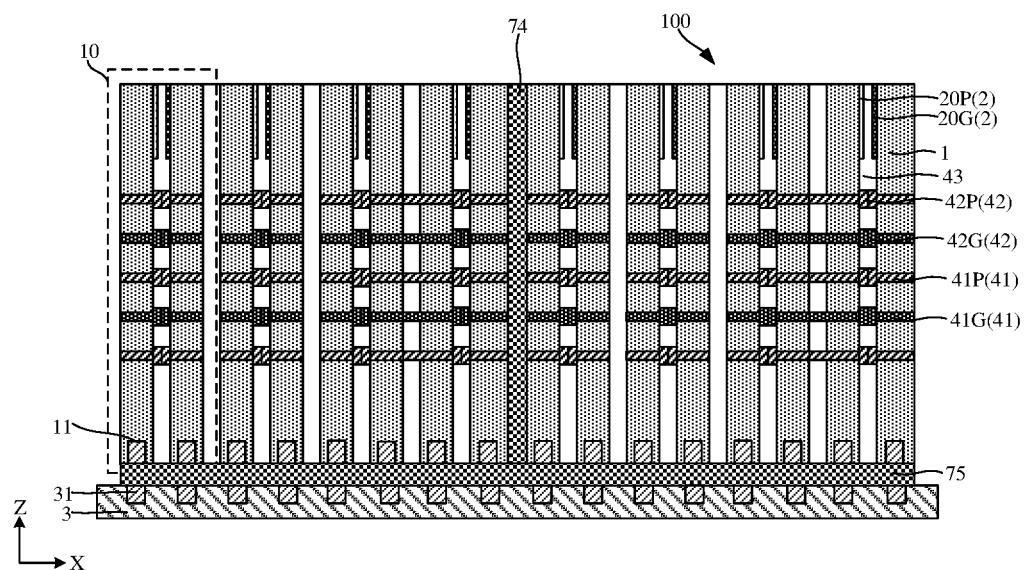

With reference to FIG. 2, FIG. 4 and FIG. 5, in some embodiments, the first adhesive film 74 completely covers opposite side surfaces of any two adjacent memory components 100. In this way, the production process is simpler, and it facilitates improving the adhesion strength of the any two adjacent memory components 100.

Figure 3:
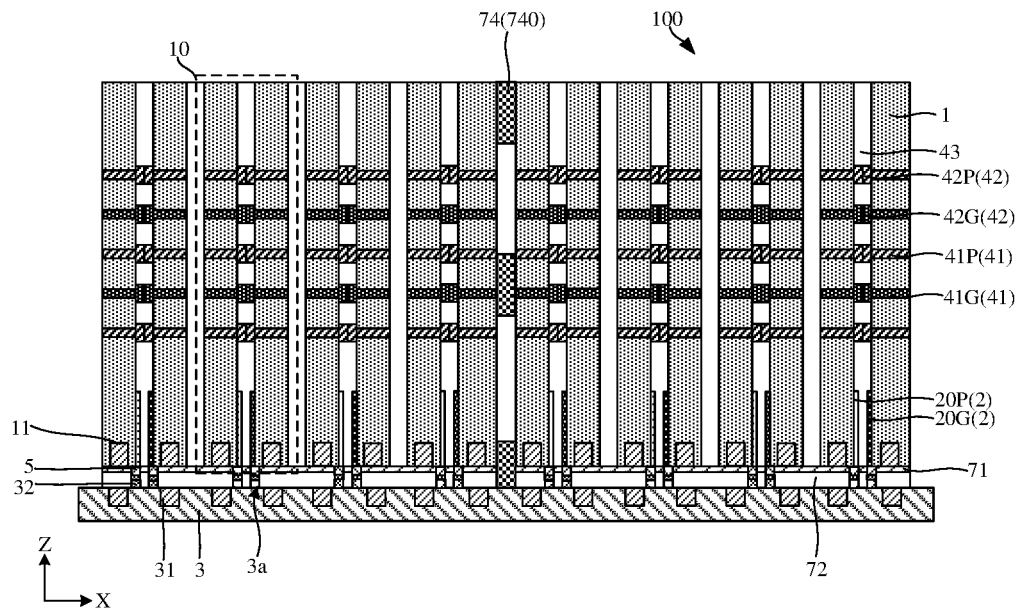

With reference to FIG. 3, in some other embodiments, the first adhesive film 74 includes a plurality of adhesive portions 740 spaced apart from each other. The adhesive portions 740 cover a portion of each of opposite side surfaces of any two adjacent memory components 100. That is, the adhesive portions 740 further expose a portion of the opposite side surfaces of the any two memory components 100, which facilitates enhancing the degree of heat dissipation of the memory components 100. Since there is an air gap between the memory components 100, thermal effect between the adjacent memory components 100 may be further reduced.

For example, the adhesive portions 740 cover edges and center portions of the opposite side surfaces of the any two adjacent memory components 100. In this way, it facilitates improving the distributing uniformity of the adhesive portions 740, thereby guaranteeing the adhesion strength.

With reference to FIG. 2 to FIG. 5, in the first direction X, a ratio of a thickness of the first adhesive film 74 to a thickness of each memory component 100 ranges from 1:75 to 1:95, for example 1:87. In a case that the ratio of the thickness of the first adhesive film to the thickness of each memory component is kept in the above range, it facilitates improving the adhesion strength of the adjacent memory components 100, and it can prevent the first adhesive film 74 from occupying excessive surface area of the logic die 3.

For example, the thickness of the first adhesive film 74 in the first direction X ranges from 4 μm to 6 μm, for example 5 μm. In this way, it facilitates improving the structural strength, and avoiding space wasting.

With reference to FIG. 4 and FIG. 5, the semiconductor structure further includes a second adhesive film 75. The second adhesive film 75 is arranged on sides of the plurality of memory components 100 away from the logic die 3 or on sides of the plurality of memory components 100 close to the logic die 3. The second adhesive film 75 extends across the plurality of memory components 100, and the second adhesive film 75 is adhered to the plurality of memory components 100. The second adhesive film 75 facilitates further improving the structural strength.

For example, with reference to FIG. 4, in a case that the power supply wiring layer 2 is led out from the lower side of the memory component 100, the second adhesive film 75 is arranged on the side of the memory component 100 away from the logic die 3. In this way, the second adhesive film 75 may be prevented from occupying the spatial position of a conductive structure that leads out a power supply wiring 20.

With reference to FIG. 5, in a case that the power supply wiring layer 2 is led out from the upper side of the memory component 100, the second adhesive film 75 is arranged on the side of the memory component 100 close to the logic die 3. Therefore, the second adhesive film 75 may be further adhered to the logic die 3, so as to fix the memory components 100 to the logic die 3.

With reference to FIG. 4 and FIG. 5, in some embodiments, the second adhesive film 75 is adhered to the first adhesive film 74, which facilitates fixing the first adhesive film 74 and the second adhesive film 75, thereby improving the structural strength.

The first adhesive film 74 and the second adhesive film 75 may be made from the same material, such as a Die Attach Film (DAF). In some other embodiments, a heat dissipation coefficient of the second adhesive film 75 may also be greater than that of the first adhesive film 74. For example, the second adhesive film 75 is doped with metal ions to dissipate heat faster, thereby improving the overall heat dissipation effect.

The method for leading out the power supply wiring layer 2 will be described in detail below.

With reference to FIG. 2 to FIG. 4, an end surface of the power supply wiring layer 2 facing towards the logic die 3 is exposed by the memory die 1. The memory die 1 is further provided with a welding bump 5. The welding bump 5 is connected to the exposed end surface of the power supply wiring layer 2. The logic die 3 is provided with a power supply port 3a. The power supply port 3a is electrically connected to the welding bump 5. That is, the power supply wiring 20 may be led out from the lower side of the memory component 100, and the welding bump 5 is configured to form a wired power supply path. In this way, it facilitates reducing the length of the power supply path, thereby reducing the power consumption.

In some other embodiments, with reference to FIG. 5, the end surface of the power supply wiring layer 2 away from the logic die 3 is exposed by the memory die 1, and the exposed end surface of the power supply wiring layer 2 may be connected to the power supply port 3a through a lead, a lead frame or other structures. That is to say, the wired power supply path and the wireless communication path are respectively arranged on the upper side and the lower side of the memory component 100, so that the electromagnetic interference of the wired power supply path to wireless communication may be reduced, so as to improve the communication quality. It should be noted that in a case that the end surface of the power supply wiring layer 2 away from the logic die 3 is exposed by the memory die 1, the power supply port 3a may not be arranged on the logic die 3, but on the substrate 8 (with reference to FIG. 20).

With reference to FIG. 7, FIG. 8, FIG. 10 and FIG. 11, FIG. 7, FIG. 8, FIG. 10 and FIG. 11 illustrate different active surfaces 13 of the memory die 1. A plurality of power supply signal lines 12 are provided in each memory die 1. The plurality of power supply signal lines 12 extend on the active surface 13, and the power supply wiring layer 2 is electrically connected to the plurality of power supply signal lines 12. In other words, the power supply wiring layer 2 supplies power to the components in the memory die 1 through the power supply signal lines 12. The connection relationship between the power supply signal lines 12 and the power supply wiring layer 2 will be described in detail below.

Different power supply signal lines 12 may provide the components in the memory die 1 with different voltage signals, such as digital signals or analog signals. The power supply signal lines 12 may be ground signal lines 12G or power signal lines 12P. Different ground signal lines 12G have different voltage signals, and different power signal lines 12P have different voltage signals.

With reference to FIG. 6, FIG. 9, FIG. 13, FIG. 15 and FIG. 17, the power supply wiring layer 2 may be a power wiring layer 2P, a ground wiring layer 2G or a hybrid wiring layer 2PG. That is to say, one power supply wiring layer 2 includes a plurality of power supply wirings 20 isolated from one another. The power supply wiring layer 2 may be divided into the above three types according to the types of the power supply wirings 20 in each power supply wiring layer 2. In a case that the power supply wirings 20 in the power supply wiring layer 2 are all power wirings 20P, this power supply wiring layer 2 is referred to as the power wiring layer 2P. In a case that the power supply wirings 20 in the power supply wiring layer 2 are all ground wirings 20G, this power supply wiring layer 2 is referred to as the ground wiring layer 2G. In a case that the power supply wiring layer 2 includes two types of power supply wirings 20, respectively the ground wirings 20G and the power wirings 20P, this power supply wiring layer 2 is referred to as the hybrid wiring layer 2PG.

The ground wiring 20G is electrically connected to a respective ground signal line 12G. The power wiring 20P is electrically connected to a respective power signal line 12P. It should be noted that the plurality of power supply wirings 20 in the power supply wiring layer 2 are insulated from one another, so that the power supply signal lines 12 with different voltage signals may be respectively led out.

In a case that one memory die 1 has its own power supply wiring layer 2, at least a portion of the power supply signal lines 12 of this memory die 1 may be directly connected to its own power supply wiring layer 2, i.e., be led out through its own power supply wiring layer 2. In a case that one memory die 1 does not have its own power supply wiring layer 2, the power supply signal lines 12 of this memory die 1 may be led out through the power supply wiring layer 2 of other memory die 1. In other words, an electric connection relationship may be established between this memory die 1 and the other memory dies 1 through the conductive through holes 41 and the bonding components 42, so that its own power supply signal lines 12 are electrically connected to the power supply signal lines 12 of other memory dies 1, so as to be further electrically connected to the power supply wiring layers 2 of the other memory dies 1, which will be described in detail below.

In the memory component 100, the plurality of memory dies 1 may be stacked and bonded to each other in a hybrid bonding manner. For example, the surface of the memory die 1 is also provided with a dielectric layer 43. The dielectric layers 43 between two adjacent memory dies 1 may be connected together by an action force, such as a molecular force. Besides, the surface of the memory die 1 may be also provided with a bonding component 42. Under a temperature rise condition, the adjacent bonding components 42 are bonded to be connected together. That is to say, the dielectric layer 43 is made from an insulating material, which may provide the isolation function. The bonding component 42 is made from a conductive material, which may provide the electrical connection function. Furthermore, the dielectric layer 43 further exposes the end surface of the power supply wiring layer 2 facing towards or away from the logic die 3, and covers the side surfaces of the power supply wiring layer 2 other than the end surfaces of the power supply wiring layer 2.

The position and quantity relationship between the memory die 1 and the power supply wiring layer 2 will be described in detail below.

In the first example, with reference to FIG. 2 to FIG. 13, each memory die 1 is provided with one power supply wiring layer 2, that is, the number of the memory dies 1 is the same with the number of the power supply wiring layers 2. Due to the larger number of the power supply wiring layers 2, the plurality of power supply signal lines 12 may be provided with sufficient lead-out positions, that is, the process of leading out the power supply signal lines 12 is simplified. In addition, the larger number of the power supply wiring layers 2 further facilitates improving the stability of power supply, thereby further improving the performance of the semiconductor structure. Furthermore, the power supply wiring layers 2 are uniformly arranged in the plurality of memory dies 1, which facilitates unifying the manufacturing process of different memory dies 1, thereby reducing the production cost.

In some embodiments, with reference to FIG. 2 to FIG. 11, two adjacent memory dies 1 form a die set 10, and two power supply wiring layers 2 in the same die set 10 are arranged between the two adjacent memory dies 1. That is to say, the two memory dies 1 in the die set 10 are bonded to each other in a front surface-to-front surface manner, i.e., in an active surface 13-to-active surface 13 manner. The two memory dies 1 in the same die set 10 share the two power supply wiring layers 2 arranged therebetween.

Specifically, with reference to FIG. 2 to FIG. 5, a conductive through hole 41 is provided in each memory die 1. Exemplarily, the conductive through hole 41 is Through-Silicon Via (TSV). A bonding component 42 is provided between the two memory dies 1 in the same die set 10. The bonding component 42 is connected to the conductive through hole 41 of each of the two memory dies 1, so that the two memory dies 1 are electrically connected to each other. Exemplarily, each memory die 1 is provided with a plurality of conductive through holes 41 spaced apart from each other, and the plurality of conductive through holes 41 are in one-to-one correspondence connection to the plurality of power supply signal lines 12 in the memory die 1. The voltage signals on the plurality of power supply signal lines 12 in the same memory die 1 are different. Correspondingly, the voltage signals on the plurality of conductive through holes 41 in the same memory die 1 are also different. In the two memory dies 1 in the same die set 10, the conductive through holes 41 with the same voltage signal are electrically connected to each other through the bonding component 42, so that the power supply signal lines 12 with the same voltage signal in the two memory dies 1 are electrically connected to each other.

For example, the conductive through holes 41 include a plurality of ground through holes 41G and a plurality of power through holes 41P. The bonding components 42 include a plurality of ground bonding components 42G and a plurality of power bonding components 42P. The ground through holes 41G are connected to the ground bonding components 42G, and the power through holes 41P are connected to the power bonding components 42P.

The conductive through holes 41 of each memory die 1 may be arranged in a third direction Z and spaced apart from each other. The third direction Z is perpendicular to the upper surface of the logic die 3. Exemplarily, the ground through holes 41G and the power through holes 41P are arranged alternately in the third direction Z, so as to reduce the electromagnetic interference between the adjacent conductive through holes 41.

Figure 6:
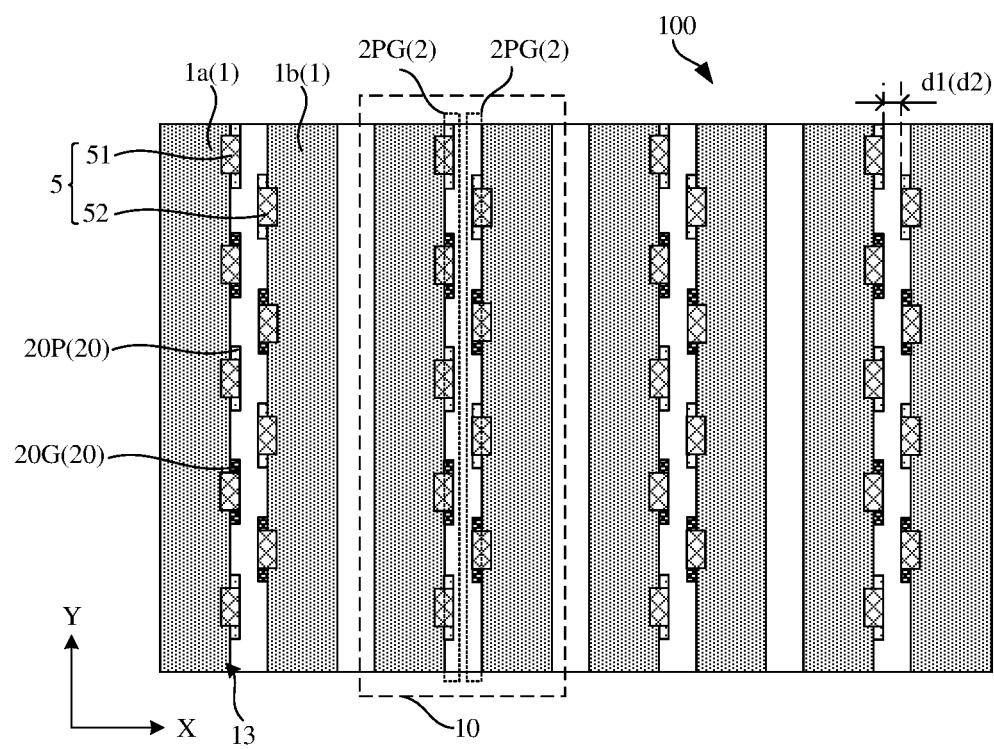
FIG. 6, FIG. 9, FIG. 13, FIG. 15 and FIG. 17 respectively illustrate bottom views of different memory components according to an embodiment of the disclosure.
Figure 7:
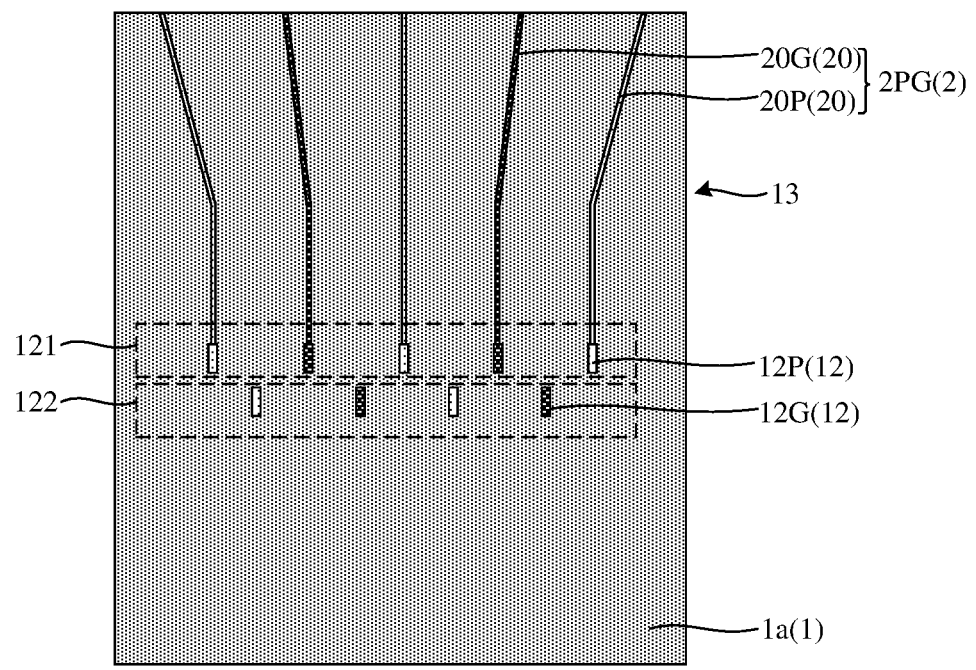
FIG. 7, FIG. 8, FIG. 10 and FIG. 11 respectively illustrate schematic diagrams of different active surfaces of memory dies according to an embodiment of the disclosure.
Figure 8:
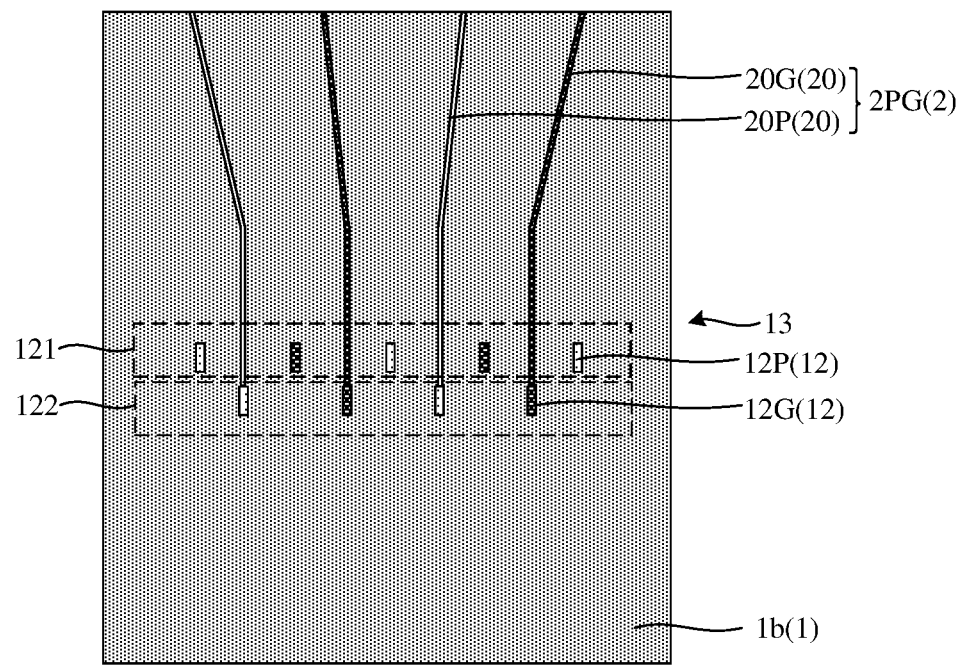

FIG. 6 is a bottom view of a memory component 100. FIG. 7 and FIG. 8 are schematic diagrams respectively showing the active surfaces 13 of the two memory dies 1 in the die set 10. FIG. 6 to FIG. 8 correspond to a same semiconductor structure. With reference to FIG. 6 to FIG. 8, the die set 10 includes a first memory die 1a and a second memory die 1b. Each of the two memory dies 1 is provided with a first power supply signal line group 121 and a second power supply signal line group 122. The power supply signal lines 12 in the first power supply signal line group 121 and the power supply signal lines 12 in the second power supply signal line group 122 include power signal lines 12P and ground signal lines 12G. The first power supply signal line groups 121 of the two memory dies 1 are led out through the power supply wiring layer 2 of the first memory die 1a, and the second power supply signal line groups 122 of the two memory dies 1 are led out through the power supply wiring layer 2 of the second memory die 1b. That is, the two power supply wiring layers 2 in the same die set 10 both are the hybrid wiring layers 2PG.

With reference to FIG. 6, in the hybrid wiring layer 2PG, the ground wirings 20G and the power wirings 20P are arranged alternately in the second direction Y, which facilitates reducing the electromagnetic interference between the adjacent power supply wirings 20.

Figure 9:
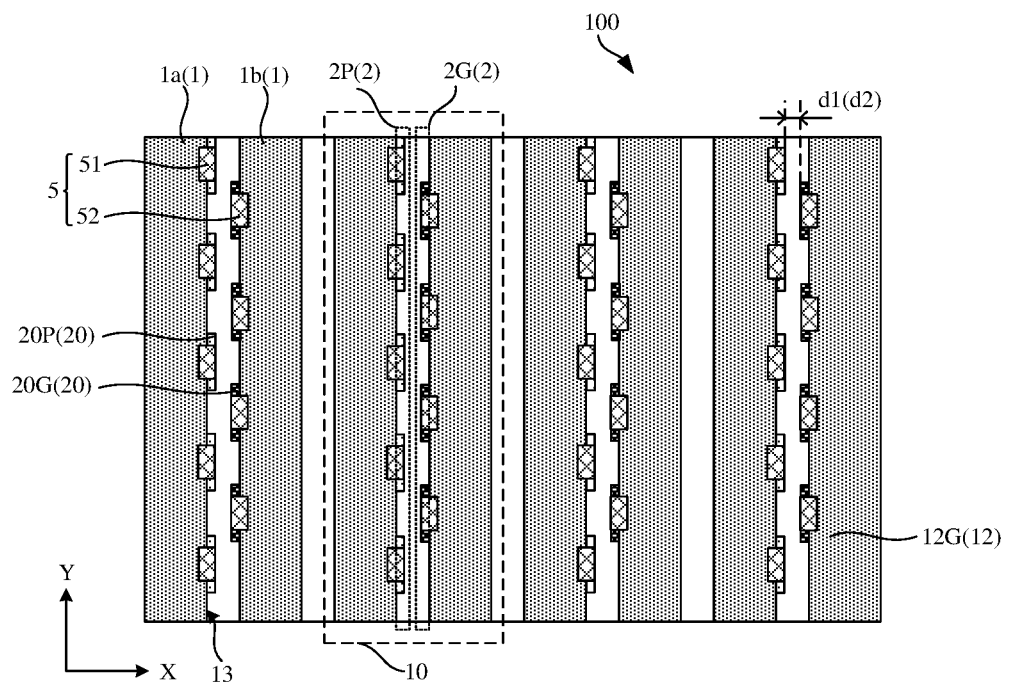
Figure 10:
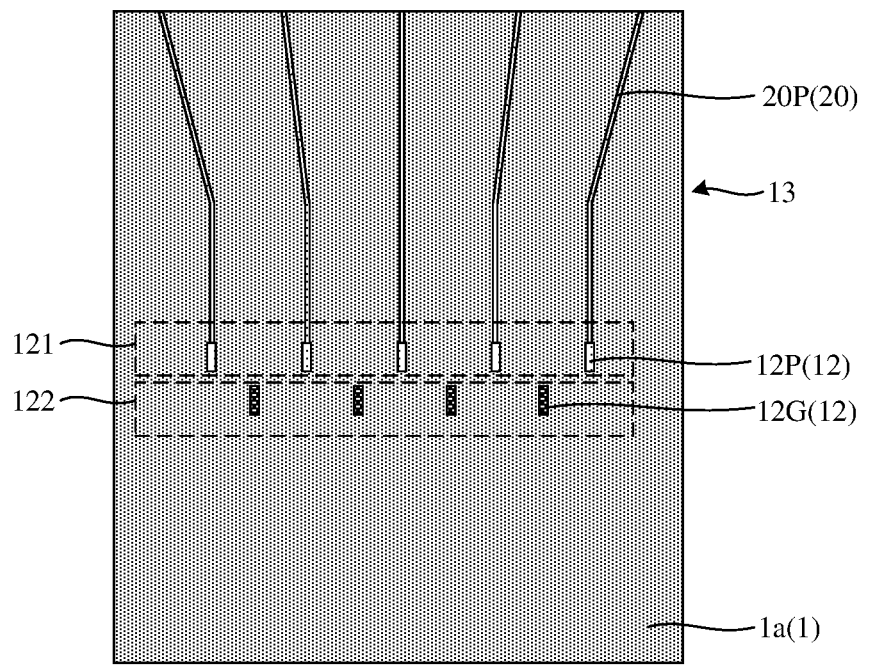
Figure 11:
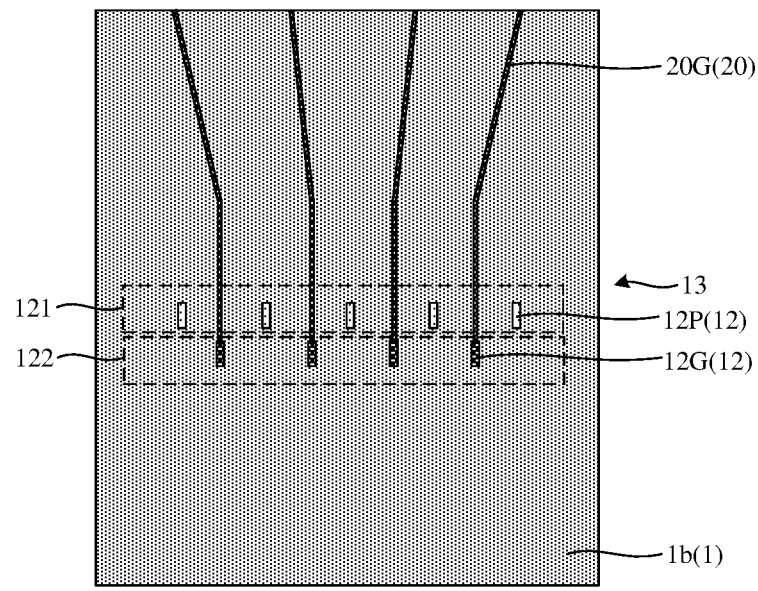

FIG. 9 is a bottom view of a memory component 100. FIG. 10 and FIG. 11 are schematic diagrams respectively showing the active surfaces 13 of the two memory dies 1 in the die set 10. FIG. 9 to FIG. 11 correspond to a same semiconductor structure. With reference to FIG. 9 to FIG. 11, the power supply signal lines 12 in the first power supply signal line groups 121 are all power signal lines 12P, and the power supply signal lines 12 in the second power supply signal line groups 122 are all ground signal lines 12G. Herein, the first power supply signal line groups 121 of the two memory dies 1 are led out through the power supply wiring layer 2 of the first memory die 1a, and the second power supply signal line groups 122 of the two memory dies 1 are led out through the power supply wiring layer 2 of the second memory die 1b. That is to say, the two power supply wiring layers 2 in the same die set 10 are respectively the power wiring layer 2P and the ground wiring layer 2G. The first power supply signal line groups 121 are electrically connected to the power wiring layer 2P, and the second power supply signal line groups 122 are electrically connected to the ground wiring layer 2G.

At this point, as can be known from FIG. 6 to FIG. 11, each memory die 1 is provided with a first power supply signal line group 121 and a second power supply signal line group 122. Each of the first power supply signal line group 121 and the second power supply signal line group 122 includes a plurality of power supply signal lines 12. The two first power supply signal line groups 121 in the same die set 10 are electrically connected to one power supply wiring layer 2, and the two second power supply signal line groups 122 in the same die set 10 are electrically connected to the other power supply wiring layer 2. That is, the power supply wiring layer 2 is shared by the two power supply signal line groups 122 in the same die set 10.

Such a design mainly has the following advantages. Firstly, the shared power supply wiring layer 2 is arranged between the two memory dies 1, so that the distance between the power supply wiring layer 2 and the two memory dies 1 can be shortened, so as to further facilitate reducing the high power consumption generated by long distance. Secondly, the insulating dielectric layer 43 may be only provided between the adjacent die sets 10, so that the number of the bonding components 42 is reduced, thereby simplifying the production process. Thirdly, since the power supply wiring layer 2 is shared by the two memory dies 1, correspondingly, the number of the power supply wirings 20 is reduced, and the number of the welding bumps 5 is reduced, which facilitates providing the welding bumps 5 with a more sufficient spatial position, thereby avoiding short circuit. Fourthly, only two memory dies 1 in the die set 10 share the power supply wiring layer 2, that is, the number of the memory dies 1 in the die set 10 is small, which facilitates guaranteeing the stability of power supply.

With reference to FIG. 6 and FIG. 9, the welding bumps 5 include a plurality of first welding bumps 51 and a plurality of second welding bumps 52. The first welding bumps 51 and the second welding bumps 52 are respectively connected to different power supply wiring layers 2 in the same die set 10. The first welding bumps 51 and the second welding bumps 52 are misaligned with one another in the first direction X. Specifically, the first welding bumps 51 connected to the same power supply wiring layer 2 are arranged in the second direction Y and spaced apart from each other, and the second welding bumps 52 connected to the same power supply wiring layer 2 are arranged in the second direction Y and spaced apart from each other. In the first direction X, the first welding bump 51 is aligned with a gap between two second welding bumps 52, and the second welding bump 52 is aligned with a gap between two first welding bumps 51. That is to say, in the first direction X, the first welding bump 51 is not perfectly aligned with the second welding bump 52. In this way, it facilitates increasing the distance between the first welding bump 51 and the second welding bump 52, thereby preventing a wrong electric connection between the first welding bump 51 and the second welding bump 52. It should be noted that the plurality of first welding bumps 51 are connected to different power supply wirings 20 in the power supply wiring layer 2, and the plurality of second welding bumps 52 are connected to different power supply wirings 20 in the power supply wiring layer 2. In some other embodiments, the first welding bump 51 may be aligned with the respective second welding bump 52 in the first direction X.

With reference to FIG. 6 and FIG. 9, in the first direction X, there is a spacing d1 between the two power supply wiring layers 2 in the same die set 10. In the first direction X, there is a second spacing d2 between the first welding bump 51 and the second welding bump 52. A ratio of the first spacing d1 to the second spacing d2 ranges from 1:1 to 1.2:1. It should be noted that in a case that the second spacing d2 is too large, the space between the adjacent memory dies 1 may be wasted. In a case that the second spacing d2 is too small, the wrong electric connection may occur between the first welding bump 51 and the second welding bump 52. In a case that the first spacing d1 and the second spacing d2 are kept in the above range, it facilitates balancing the above two problems. Exemplarily, as shown in FIG. 6 and FIG. 9, the first spacing d1 may be identical to the second spacing d2. That is, the opposite sidewalls of the first welding bump 51 and the second welding bump 52 are flush with the opposite sidewalls of the two power supply wiring layers 2.

Figure 12:
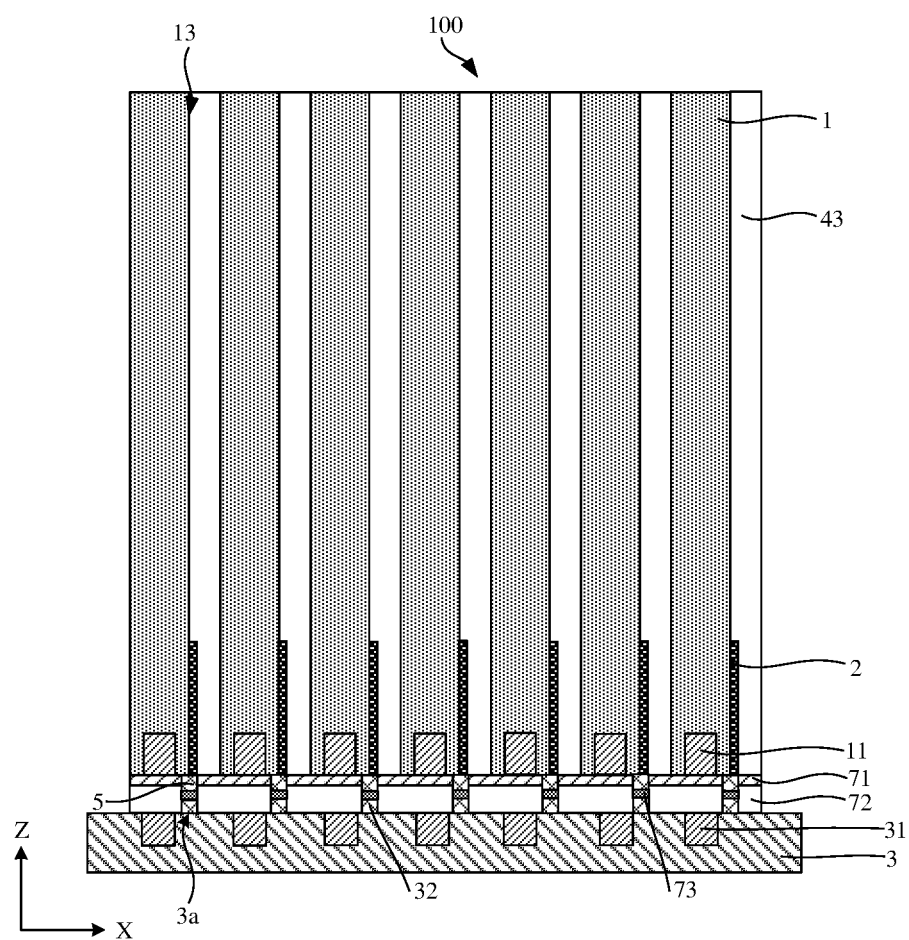
FIG. 12, FIG. 14 and FIG. 16 respectively illustrate partial sectional views of different semiconductor structures according to an embodiment of the disclosure.
Figure 13:
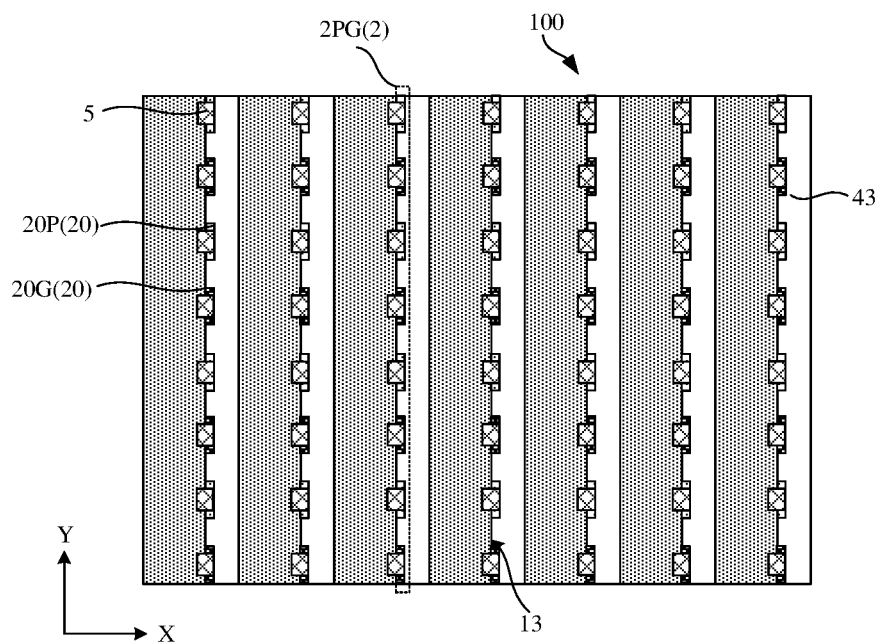

With reference to FIG. 12 and FIG. 13, FIG. 12 is a partial sectional view, and FIG. 13 is a bottom view of a memory component 100 shown in FIG. 12. The power supply signal lines 12 in the same memory die 1 are connected to the power supply wiring layer 2. The power supply wiring layers 2 of different memory dies 1 are independent of each other, and the power supply signal lines of different memory dies 1 are independent of each other. That is to say, the power supply signal lines 12 of the plurality of memory dies 1 is not necessary to be eclectically connected to each other through the conductive through holes 41 and the bonding components 42. The power supply signal lines 12 in each memory die 1 may be led out through the power supply wiring layer 2 of the memory die 1 itself, without being led out through the power supply wiring layers 2 of other memory dies 1. The power supply signal lines 12 of each memory die 1 may be led out independently, which facilitates improving the stability of power supply. In addition, the preparation operations of the bonding components 42 and the conductive through holes 41 may further be omitted, thereby reducing the production cost.

With reference to FIG. 13, for example, the power supply wiring layer 2 of each memory die 1 may be the hybrid wiring layer 2PG, and the power wirings 20P and the ground wirings 20G are arranged alternately in the second direction Y, so as to reduce the electromagnetic interference. Furthermore, the plurality of power supply wiring layers 2 may be formed on the same side of the memory die 1, thereby unifying manufacturing processes of the power supply wiring layers 2.

Moreover, the power wirings 20P of the plurality of memory dies 1 may be arranged in a straight line in the first direction X, and the ground wirings 20G of the plurality of memory dies 1 may be arranged in a straight line in the first direction X. Alternatively, the power wirings 20P and the ground wirings 20G may be alternately arranged in a straight line in the first direction X. In this way, it facilitates improving the uniformity of the semiconductor structure, and simplifying the production process.

Figure 14:
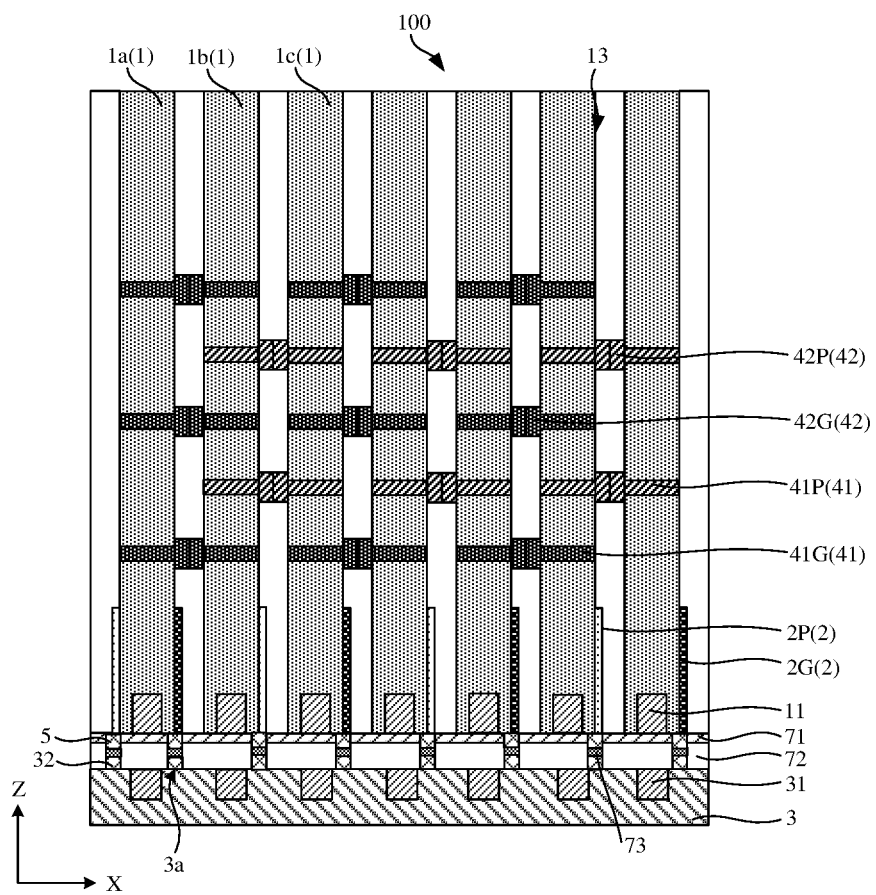
Figure 15:
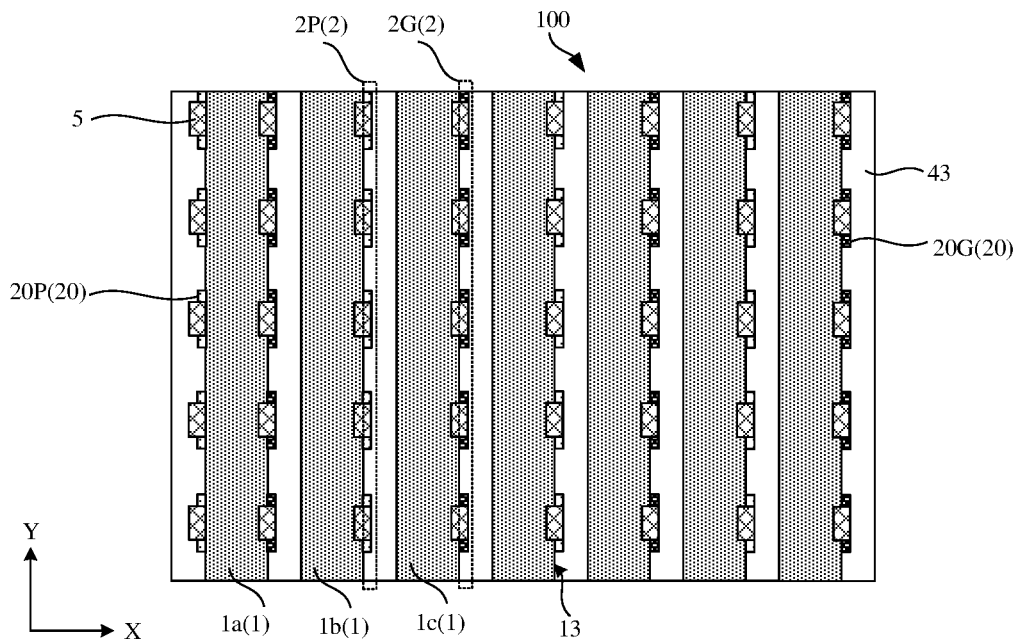

In the second example, the number of the power supply wiring layers 2 may be greater than the number of the memory dies 1. For example, with reference to FIG. 14 and FIG. 15, FIG. 14 is a partial sectional view, and FIG. 15 is a bottom view of a memory component shown in FIG. 14. A power supply wiring layer 2 is provided between two adjacent memory dies 1, and the power supply wiring layer 2 is electrically connected to the memory dies 1 on both sides of the power supply wiring layer 2. A power supply wiring layer 2 is provided on each of the head side and the tail side of the memory component 100 and is electrically connected to the memory die 1 on each of the head side and the tail side of the memory component. That is to say, except for the two power supply wiring layers 2 on the head side and the tail side of the memory component, the power supply wiring layer 2 in the middle position is shared by the memory dies 1 on both sides of the power supply wiring layer 2. The memory dies 1 on the head side and the tail side of the memory component 100 may further be understood as the memory dies 1 on the two outermost sides of the memory component 100. One power supply wiring layer 2 in the middle position is connected to the power supply signal lines 12 of the two memory dies 1, which facilitates reducing the number of the welding bumps 5, and simplifying the production process. Besides, the power supply wiring layers 2 are uniformly distributed in the memory component 100, which facilitates simplifying the production process.

As shown in FIG. 15, the power supply wiring layers 2 include power wiring layers 2P and ground wiring layers 2G. The power wiring layers 2P include a plurality of power wirings 20P, and the ground wiring layers 2G include a plurality of ground wirings 20G. The power wiring layers 2P and the ground wiring layers 2G are alternately arranged in the first direction X. In some other embodiments, all the power supply wiring layers 2 may further be hybrid wiring layers 2PG, and the voltage signals of the power supply signal lines 12 led out from two adjacent hybrid wiring layers 2PG are different.

With reference to FIG. 14 and FIG. 15, by way of examples, the way to share the power supply wiring layer 2 will be described below. The power wiring layer 2P arranged on the head side of the memory component 100 may be directly connected to the power signal lines 12P of the first memory die 1a. Therefore, the first memory die 1a may not have the power through holes 41P and power bonding components 42P. The first memory die 1a and the second memory die 1b share the ground wiring layer 2G, that is, the ground signal lines 12G of the first memory die 1a and the second memory die 1b are connected to each other through the ground through holes 41G and the ground bonding components 42G, and are led out through the ground wiring layer 2G between the first memory die and the second memory die. The second memory die 1b and the third memory die 1c share the power wiring layer 2P, that is, the power signal lines 12P of the second memory die 1b and the third memory die 1c are connected to each other through the power through holes 41P and the power bonding components 42P, and are led out through the power wiring layer 2P between the second memory die and the third memory die. Since the second memory die 1b and the third memory die 1c do not share the ground wiring layer 2G, the ground through holes 41G and the ground bonding components 42G of the second memory die 1b and the third memory die 1c will not be electrically connected to each other.

That is to say, in a case that the power supply wiring layer 2 between the two adjacent memory dies 1 is the power wiring layer 2P, these two memory dies 1 are electrically connected to each other through the power through holes 41P and the power bonding components 42P. Similarly, in a case that the power supply wiring layer 2 between the two adjacent memory dies 1 is the ground wiring layer 2G, these two memory dies 1 are electrically connected to each other through the ground through holes 41G and the ground bonding components 42G.

It should be noted that since there are one more power supply wiring layers 2 than the memory dies 1, one of the two power supply wiring layers 2 on the head side and the tail side of the memory component may not extend along the active surface 13 of the memory die 1, that is, may be arranged on the back surface of the memory die 1. The remaining power supply wiring layers 2 are still arranged on the active surfaces 13 of the memory dies 1.

Figure 16:
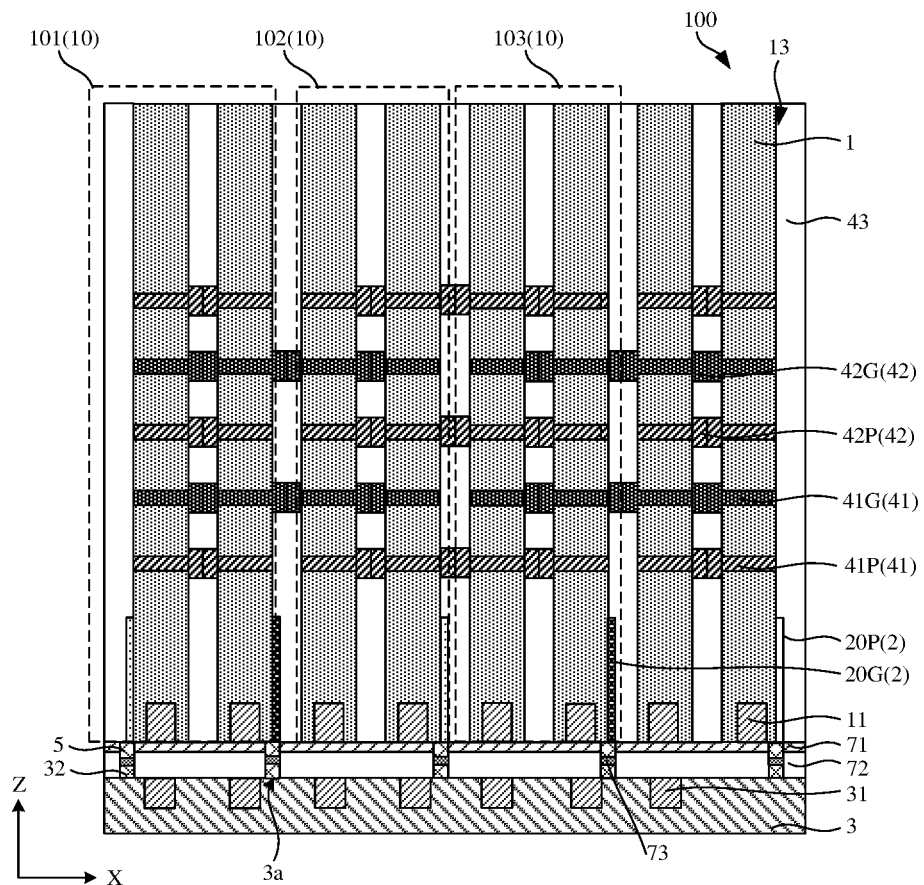
Figure 17:
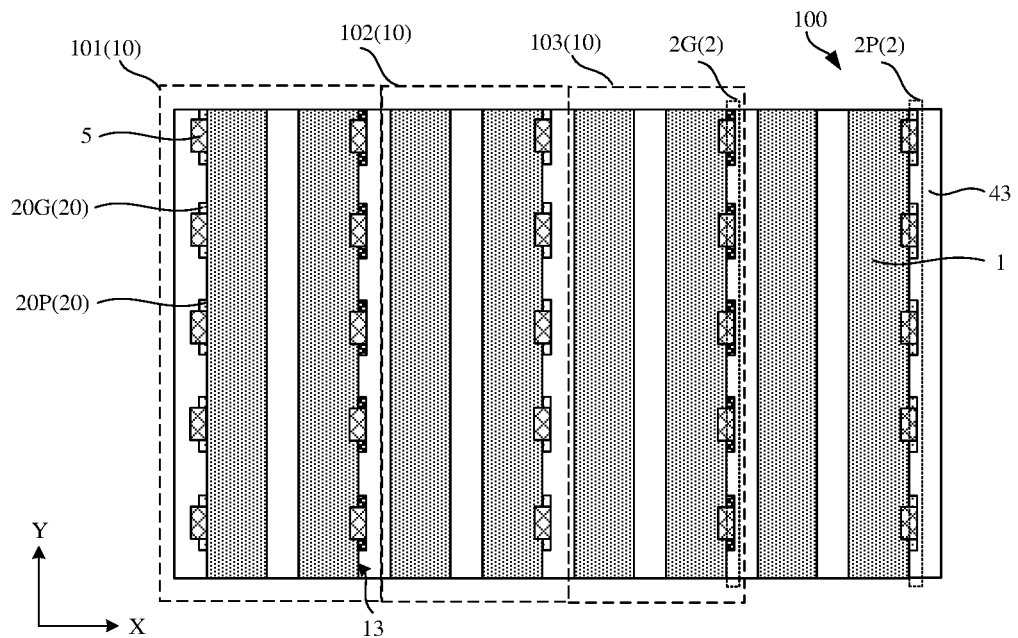

In the third example, the number of the power supply wiring layers 2 may also be less than the number of the memory dies 1. For example, with reference to FIG. 16 and FIG. 17, FIG. 16 is a partial sectional view, and FIG. 17 is a bottom view of a memory component 100 shown in FIG. 16. FIG. 13 shows a partial structure in the semiconductor structure. At least two adjacent memory dies 1 are bonded to each other to form the die set 10. One power supply wiring layer 2 is provided between the two adjacent die sets 10, and the power supply wiring layer 2 is electrically connected to the memory dies 1 of the die sets 10 on both sides of the power supply wiring layer 2. One power supply wiring layer 2 is provided on each of the head side and the tail side of the memory component 100, and is electrically connected to each die set 10 on each of the head side and the tail side of the memory component.

That is to say, except for the two power supply wiring layers 2 on the head side and the tail side of the memory component, the power supply wiring layer 2 in the middle position is shared by the die sets 10 on both sides of the power supply wiring layer 2. One power supply wiring layer 2 in the middle position is connected to the power supply signal lines 12 in the two die sets 10. It should be noted that the less the power supply wiring layers 2 are, the less the welding bumps 5 are. Therefore, it facilitates increasing the distances between the welding bumps 5 and coils in the first wireless communication component 31 and between the welding bumps 5 and coils in the second wireless communication component 11, thereby further reducing the electromagnetic interference generated by the welding bumps 5 and the coils, and avoiding signal loss.

Exemplarily, each die set 10 is provided with two memory dies 1. The power supply signal lines 12 with the same voltage signal in these two memory dies 1 are electrically connected to each other through the conductive through holes 41 and the bonding components 42.

With reference to FIG. 16 and FIG. 17, by way of examples, the way to share the power supply wiring layer 2 will be described below. A first die set 101 and a second die set 102 share the ground wiring layer 2G. That is, the ground signal lines 12G of the first die set and the ground signal lines 12G of the second die set are connected to each other through the ground through holes 41G and the ground bonding components 42G, and are led out through the ground wiring layer 2G between the first die set and the second die set. The first die set 101 and the second die set 102 do not share the power wiring layer 2P. Therefore, the power through holes 41P and the power bonding components 42P of the first die set are not electrically connected to the power through holes 41P and the power bonding components 42P of the second die set. The second die set 102 and a third die set 103 share the power wiring layer 2P. That is, the power signal lines 12P of the second die set and the power signal lines 12P of the third die set are connected to each other through the power through holes 41P and the power bonding components 42P, and are led out through the power wiring layer 2P between the second die set and the third die set.

In some embodiments, with reference to FIG. 2 to FIG. 4, FIG. 12, FIG. 14 and FIG. 16, the surface of the memory component 100 towards the logic die 3 is further provided with an insulating film 71. The insulating film 71 may further be arranged between any two adjacent welding bumps 5, which may isolate the welding bumps 5 from each other. In addition, the insulating film 71 may further be made from a material with better adhesion, so as to fix the welding bumps 5. Exemplarily, the insulating film 71 may be a polyimide film. The polyimide film has excellent resistance to high and low temperatures, electrical insulation, and adhesion.

In some embodiments, a filling adhesive layer 72 is further provided between the logic die 3 and the memory dies 1. The filling adhesive layer 72 covers the welding bumps 5. In addition, the filling adhesive layer 72 may further cover the insulating film 71 and welding pads 32. The filling adhesive layer 72 may fix the welding bumps 5 and the welding pads 32, thereby guaranteeing the connecting strength between the memory component 100 and the logic die 3.

Figure 18:
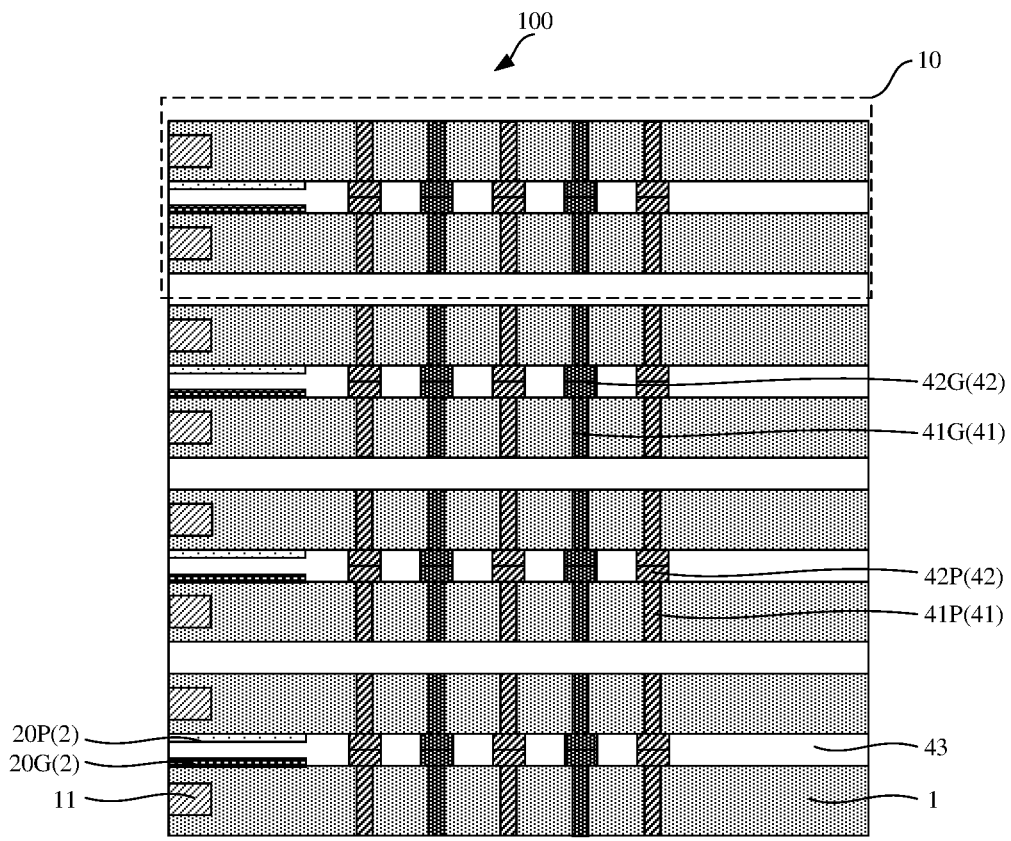
FIG. 18 and FIG. 19 respectively illustrate schematic diagrams of structures corresponding to various operations in a method for manufacturing a semiconductor structure according to another embodiment of the disclosure.
Figure 19:
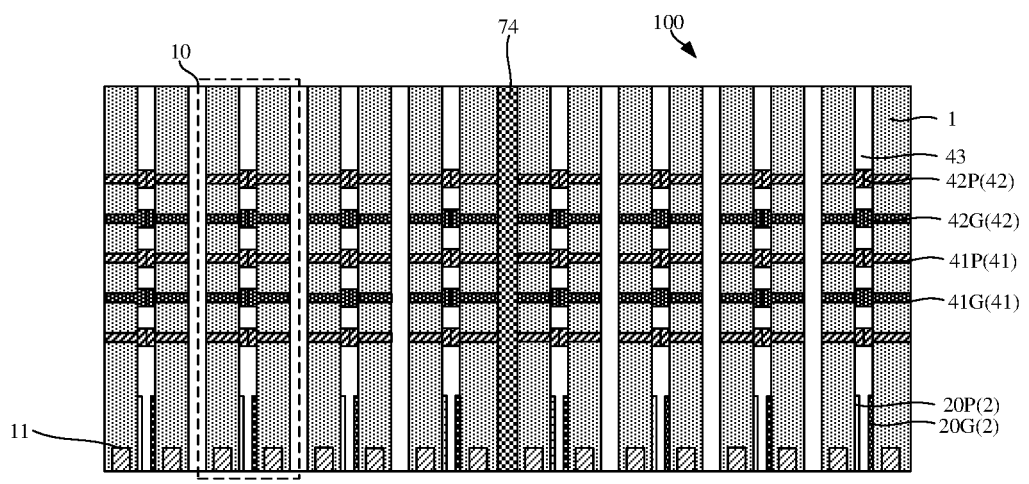

As shown in FIG. 18, FIG. 19 and FIG. 2, another embodiment of the disclosure provides a method for manufacturing a semiconductor structure. The method may be used for manufacturing the semiconductor structure provided in the abovementioned embodiments. Detailed description about the semiconductor structure may refer to the aforementioned embodiments.

Specifically, with reference to FIG. 18, a power supply wiring layer 2 is firstly formed on an active surface of each memory die 1, so as to lead the power supply signal lines 12 to the edge position of the side surface of the memory die 1. A dielectric layer 43 covering the power supply wiring layer 2 is formed, and a bonding component 42 arranged in the dielectric layer 43 is formed.

After the bonding component 42 is formed, a plurality of memory dies 1 are horizontally stacked on one another, and are bonded to each other in a hybrid bonding manner, so as to form the memory component 100. Exemplarily, each memory component 100 includes eight memory dies 1.

With reference to FIG. 19, a plurality of memory components 100 are adhered together by the first adhesive film 74, so that the capacity density and the volume of the memory dies 1 are increased. The memory components 100 are rotated by 90 degrees, so as to subsequently facilitate the preparation of the welding bumps 5 on the side surfaces of the memory components 100. The welding bumps 5 are connected to the power supply wiring layers 2.

With reference to FIG. 2, a logic die 3 is provided. The plurality of memory components 100 are welded to the logic die 3, in which the upper surface of the logic die 3 is parallel to a first direction X. The welding bump 5 is electrically connected to the power supply port 3a. Exemplarily, the welding bump 5 is welded to the welding pad 32 of the logic die 3 through a welding paste layer 73.

At this point, the semiconductor structure provided with the plurality of memory components 100 may be formed. Although the horizontal sectional area of the memory components 100 after being rotated is relatively small, the plurality of memory components 100 are adhered together by the first adhesive film 74, which may enhance the structural strength, and meanwhile, may improve the problem that the number of stacked layers is small due to the bonding process.

Figure 20:
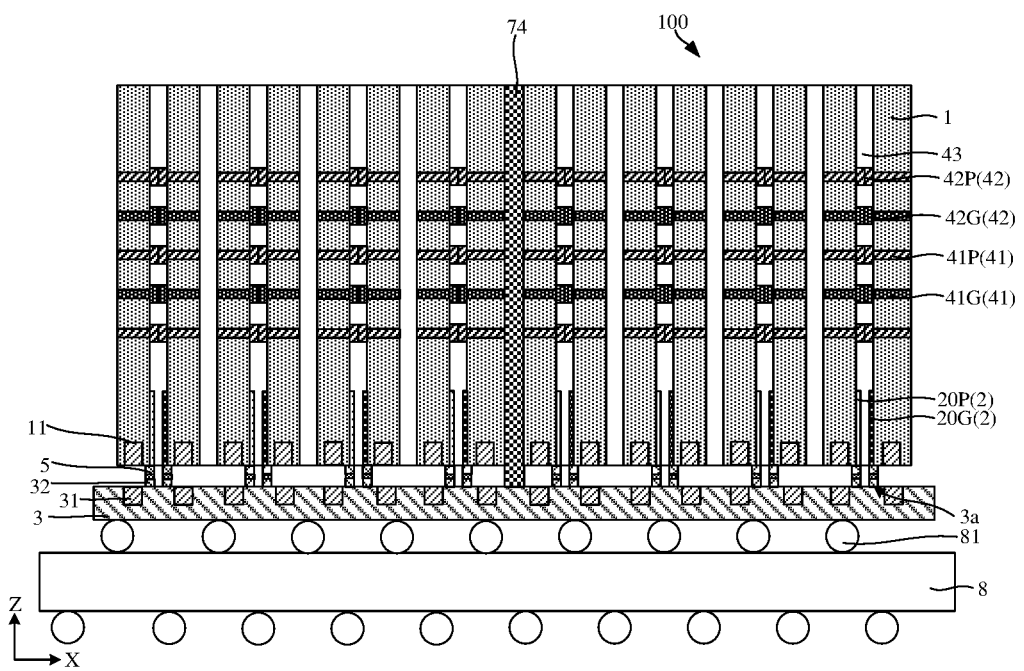
FIG. 20 illustrates a schematic diagram of a semiconductor device according to yet another embodiment of the disclosure.

As shown in FIG. 20, yet another embodiment of the disclosure further provides a semiconductor device. The semiconductor device may include the semiconductor structure provided by the aforementioned embodiments. The detailed description about the semiconductor structure may refer to the aforementioned embodiments.

The semiconductor device includes: a substrate 8; a logic die 3 arranged on the substrate 8 and provided with a first wireless communication component 31; a plurality of memory components 100 arrayed in a first direction and stacked on an upper surface of the logic die 3, the first direction X being parallel to the upper surface of the logic die 3; and a first adhesive film 74 arranged between any two adjacent memory components 100 of the plurality of memory components and adhered to the any two adjacent memory components 100. Each of the plurality of memory components 100 includes a plurality of memory dies 1 arrayed in the first direction X. Each of the plurality of memory dies 1 is provided with a second wireless communication component 11. The second wireless communication component 11 is in wireless communication with the first wireless communication component 31. At least one of the plurality of memory dies 1 is provided with a power supply wiring layer 2. The power supply wiring layer 2 extends towards the logic die 3 along an active surface 13 of the at least one of the plurality of memory dies 1.

The substrate 8 may provide the logic die 3 and the memory components 100 with functions such as electric connection, protection, support, head dissipation and assembly. The logic die 3 may be connected to the substrate 8 through solder balls 81. The substrate 8 may be provided with a power supply, so that the power supply port 3a of the logic die 3 is connected to the power supply on the substrate 8, so as to supply power to the memory dies 1.

The technical solution provided by the embodiments of the disclosure at least has the following advantages. The plurality of memory modules are adhered to each other by the first adhesive film, so that the capacity density of the memory dies is increased, and the structural strength is improved. The power supply wiring layer extends along the active surface of the memory die, so that the power supply wiring layer can be manufactured by utilizing the original back-end process of the memory die, so as to make the process simpler. In addition, the stacking direction of the plurality of memory dies is parallel to the upper surface of the logic die, so that the communication distance between each memory die and the logic die is the same, thereby reducing the difference in the communication delay. Furthermore, the memory dies are in wireless communication with the logic die, so that it is unnecessary to manufacture the wired communication components on the side surfaces of the memory dies, thereby reducing the process difficulty.

The invention claimed is:

1. A semiconductor structure, comprising:
a logic die provided with a first wireless communication component;
a plurality of memory components arrayed in a first direction and stacked on an upper surface of the logic die, wherein the first direction is parallel to the upper surface of the logic die; and
a first adhesive film arranged between any two adjacent memory components of the plurality of memory components and adhered to the any two adjacent memory components,
wherein each of the plurality of memory components comprises a plurality of memory dies arrayed in the first direction, wherein each of the plurality of memory dies is provided with a second wireless communication component, wherein the second wireless communication component is in wireless communication with the first wireless communication component, and
wherein at least one of the plurality of memory dies is provided with a power supply wiring layer, wherein the power supply wiring layer extends towards the logic die along an active surface of the at least one of the plurality of memory dies;
wherein each of the memory dies is provided with a plurality of power supply signal lines, and the power supply wiring layer is electrically connected to the plurality of power supply signal lines;
an end surface of the power supply wiring layer facing towards the logic die is exposed by the at least one of the plurality of memory dies;
the at least one of the plurality of memory dies is further provided with a welding bump, wherein the welding bump is connected to the end surface; and
the logic die is provided with a power supply port, wherein the power supply port is electrically connected to the welding bump;
wherein each of the plurality of memory dies is provided with the power supply wiring layer;
wherein a plurality of welding bumps are connected to the same power supply wiring layer, and the plurality of welding bumps are arranged in a second direction and spaced apart from each other, wherein the second direction is parallel to the upper surface of the logic die and perpendicular to the first direction; and
wherein the plurality of welding bumps connected to one power supply wiring layer are misaligned, in the first direction, with the plurality of welding bumps connected to another power supply wiring layer adjacent to the one power supply wiring layer.

2. The semiconductor structure according to claim 1, wherein in the first direction, a ratio of a thickness of the first adhesive film to a thickness of each of the plurality of memory components ranges from 1:75 to 1:95.

3. The semiconductor structure according to claim 2, wherein the thickness of the first adhesive film in the first direction ranges from 4 μm to 6 μm.

4. The semiconductor structure according to claim 1, wherein the first adhesive film completely covers opposite side surfaces of the any two adjacent memory components.

5. The semiconductor structure according to claim 1, wherein the first adhesive film comprises a plurality of adhesive portions spaced apart from each other,
wherein the plurality of adhesive portions cover a portion of each of opposite side surfaces of the any two adjacent memory components.

6. The semiconductor structure according to claim 5, wherein the plurality of adhesive portions cover edges and center portions of the opposite side surfaces of the any two adjacent memory components.

7. The semiconductor structure according to claim 1, further comprising: a second adhesive film, wherein the second adhesive film is arranged on sides of the plurality of memory components away from the logic die or on sides of the plurality of memory components close to the logic die, the second adhesive film extends across the plurality of memory components, and the second adhesive film is adhered to the plurality of memory components.

8. The semiconductor structure according to claim 7, wherein the second adhesive film is adhered to the first adhesive film.

9. The semiconductor structure according to claim 1, wherein each of two memory dies arranged adjacent to two opposite sides of the first adhesive film is provided with the welding bump.

10. The semiconductor structure according to claim 1, wherein a conductive through hole is provided in each of the plurality of memory dies;
two adjacent memory dies of the plurality of memory dies form a die set;
a bonding component is provided between the two adjacent memory dies in the same die set, wherein the bonding component is connected to the conductive through hole of each of the two adjacent memory dies to electrically connect the two adjacent memory dies with each other;

two power supply wiring layers in the same die set are arranged between the two adjacent memory dies;

each of the plurality of memory dies is provided with a first power supply signal line group and a second power supply signal line group, wherein each of the first power supply signal line group and the second power supply signal line group comprises the plurality of power supply signal lines; and two first power supply signal line groups of the two adjacent memory dies in the same die set are electrically connected to one of the two power supply wiring layers, and two second power supply signal line groups of the two adjacent memory dies in the same die set are electrically connected to another one of the two power supply wiring layers.

11. The semiconductor structure according to claim 10, wherein the one of the two power supply wiring layers in the same die set is a power wiring layer, and the other one of the two power supply wiring layers in the same die set is a ground wiring layer;

wherein the plurality of power supply signal lines in the first power supply signal line group are power signal lines, and the first power supply signal line group is electrically connected to the power wiring layer, and wherein the plurality of power supply signal lines in the second power supply signal line group are ground signal lines, and the second power supply signal line group is electrically connected to the ground wiring layer.

12. A semiconductor device, comprising:

a substrate;

a logic die arranged on the substrate and provided with a first wireless communication component;

a plurality of memory components arrayed in a first direction and stacked on an upper surface of the logic die, wherein the first direction is parallel to the upper surface of the logic die; and a first adhesive film arranged between any two adjacent memory components of the plurality of memory components and adhered to the any two adjacent memory components, wherein each of the plurality of memory components comprises a plurality of memory dies arrayed in the first direction, each of the plurality of memory dies is provided with a second wireless communication component, wherein the second wireless communication component is in wireless communication with the first wireless communication component; and wherein at least one of the plurality of memory dies is provided with a power supply wiring layer, wherein the power supply wiring layer extends towards the logic die along an active surface of the at least one of the plurality of memory dies;

wherein each of the memory dies is provided with a plurality of power supply signal lines, and the power supply wiring layer is electrically connected to the plurality of power supply signal lines;

an end surface of the power supply wiring layer facing towards the logic die is exposed by the at least one of the plurality of memory dies;

the at least one of the plurality of memory dies is further provided with a welding bump, wherein the welding bump is connected to the end surface; and the logic die is provided with a power supply port, wherein the power supply port is electrically connected to the welding bump;

wherein each of the plurality of memory dies is provided with the power supply wiring layer;

wherein a plurality of welding bumps are connected to the same power supply wiring layer, and the plurality of welding bumps are arranged in a second direction and spaced apart from each other, wherein the second direction is parallel to the upper surface of the logic die and perpendicular to the first direction; and wherein the plurality of welding bumps connected to one power supply wiring layer are misaligned, in the first direction, with the plurality of welding bumps connected to another power supply wiring layer adjacent to the one power supply wiring layer.

13. The semiconductor structure according to claim 12, wherein a conductive through hole is provided in each of the plurality of memory dies;

two adjacent memory dies of the plurality of memory dies form a die set;

a bonding component is provided between the two adjacent memory dies in the same die set, wherein the bonding component is connected to the conductive through hole of each of the two adjacent memory dies to electrically connect the two adjacent memory dies with each other;

two power supply wiring layers in the same die set are arranged between the two adjacent memory dies;

each of the plurality of memory dies is provided with a first power supply signal line group and a second power supply signal line group, wherein each of the first power supply signal line group and the second power supply signal line group comprises the plurality of power supply signal lines; and two first power supply signal line groups of the two adjacent memory dies in the same die set are electrically connected to one of the two power supply wiring layers, and two second power supply signal line groups of the two adjacent memory dies in the same die set are electrically connected to another one of the two power supply wiring layers.

14. The semiconductor structure according to claim 13, wherein the one of the two power supply wiring layers in the same die set is a power wiring layer, and the other one of the two power supply wiring layers in the same die set is a ground wiring layer;

wherein the plurality of power supply signal lines in the first power supply signal line group are power signal lines, and the first power supply signal line group is electrically connected to the power wiring layer, and wherein the plurality of power supply signal lines in the second power supply signal line group are ground signal lines, and the second power supply signal line group is electrically connected to the ground wiring layer.

15. A semiconductor structure, comprising:

a logic die provided with a first wireless communication component;

a plurality of memory components arrayed in a first direction and stacked on an upper surface of the logic die, wherein the first direction is parallel to the upper surface of the logic die; and a first adhesive film arranged between any two adjacent memory components of the plurality of memory components and adhered to the any two adjacent memory components, wherein each of the plurality of memory components comprises a plurality of memory dies arrayed in the first direction, wherein each of the plurality of memory dies is provided with a second wireless communication component, wherein the second wireless communication component is in wireless communication with the first wireless communication component, and wherein at least one of the plurality of memory dies is provided with a power supply wiring layer, wherein the power supply wiring layer extends towards the logic die along an active surface of the at least one of the plurality of memory dies;

wherein each of the memory dies is provided with a plurality of power supply signal lines, and the power supply wiring layer is electrically connected to the plurality of power supply signal lines;

an end surface of the power supply wiring layer facing towards the logic die is exposed by the at least one of the plurality of memory dies;

the at least one of the plurality of memory dies is further provided with a welding bump, wherein the welding bump is connected to the end surface; and the logic die is provided with a power supply port, wherein the power supply port is electrically connected to the welding bump;

wherein each of the plurality of memory dies is provided with the power supply wiring layer;

wherein a conductive through hole is provided in each of the plurality of memory dies;

two adjacent memory dies of the plurality of memory dies form a die set;

a bonding component is provided between the two adjacent memory dies in the same die set, wherein the bonding component is connected to the conductive through hole of each of the two adjacent memory dies to electrically connect the two adjacent memory dies with each other;

two power supply wiring layers in the same die set are arranged between the two adjacent memory dies;

each of the plurality of memory dies is provided with a first power supply signal line group and a second power supply signal line group, wherein each of the first power supply signal line group and the second power supply signal line group comprises the plurality of power supply signal lines; and two first power supply signal line groups of the two adjacent memory dies in the same die set are electrically connected to one of the two power supply wiring layers, and two second power supply signal line groups of the two adjacent memory dies in the same die set are electrically connected to another one of the two power supply wiring layers.

16. The semiconductor structure according to claim 15, wherein the one of the two power supply wiring layers in the same die set is a power wiring layer, and the other one of the two power supply wiring layers in the same die set is a ground wiring layer;

wherein the plurality of power supply signal lines in the first power supply signal line group are power signal lines, and the first power supply signal line group is electrically connected to the power wiring layer, and wherein the plurality of power supply signal lines in the second power supply signal line group are ground signal lines, and the second power supply signal line group is electrically connected to the ground wiring layer.

17. The semiconductor structure according to claim 15, wherein the first adhesive film completely covers opposite side surfaces of the any two adjacent memory components.

18. The semiconductor structure according to claim 15, wherein the first adhesive film comprises a plurality of adhesive portions spaced apart from each other, wherein the plurality of adhesive portions cover a portion of each of opposite side surfaces of the any two adjacent memory components.

19. The semiconductor structure according to claim 18, wherein the plurality of adhesive portions cover edges and center portions of the opposite side surfaces of the any two adjacent memory components.

20. The semiconductor structure according to claim 15, further comprising: a second adhesive film, wherein the second adhesive film is arranged on sides of the plurality of memory components away from the logic die or on sides of the plurality of memory components close to the logic die, the second adhesive film extends across the plurality of memory components, and the second adhesive film is adhered to the plurality of memory components.

* * * * *